(12) United States Patent
Oh et al.

(10) Patent No.: US 8,330,661 B2
(45) Date of Patent: Dec. 11, 2012

(54) SYSTEM AND METHOD FOR MEASURING ANTENNA RADIATION PATTERN IN FRESNEL REGION BASED ON PHI-VARIATION METHOD

(75) Inventors: Soon-Soo Oh, Daejon (KR); Yong-Hee Cho, Daejon (KR); Je-Hoon Yun, Daejon (KR); Joung-Myoun Kim, Daejon (KR); Jung-Ick Moon, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 319 days.

(21) Appl. No.: 12/516,825

(22) PCT Filed: Nov. 30, 2007

(86) PCT No.: PCT/KR2007/006111
§ 371 (c)(1),
(2), (4) Date: May 29, 2009

(87) PCT Pub. No.: WO2008/069495
PCT Pub. Date: Jun. 12, 2008

(65) Prior Publication Data
US 2010/0073246 A1   Mar. 25, 2010

(30) Foreign Application Priority Data
Dec. 4, 2006 (KR) .................. 10-2006-0121761

(51) Int. Cl.
*G01R 29/10* (2006.01)
(52) U.S. Cl. ........ 343/703; 343/765; 343/763; 340/360; 455/67.16
(58) Field of Classification Search .................. 343/703, 343/765, 763; 342/360; 455/67.16
See application file for complete search history.

(56) References Cited

U.S. PATENT DOCUMENTS

| | | | | |
|---|---|---|---|---|
| 3,662,389 A | * | 5/1972 | Coffin et al. | 342/360 |
| 4,201,987 A | * | 5/1980 | Tricoles et al. | 343/703 |
| 2006/0194554 A1 | * | 8/2006 | Tsividis | 455/226.2 |

FOREIGN PATENT DOCUMENTS

| | | |
|---|---|---|
| KR | 10-0594192 B1 | 6/2006 |
| WO | 2004/057349 A1 | 7/2004 |
| WO | 2006/004220 A1 | 1/2006 |
| WO | 2006/047677 A1 | 5/2006 |

OTHER PUBLICATIONS

Gary Evans; "Far Field Correction for Short Antenna Ranges" Proc. AMTA, pp. 34-1-34-9, 1985).
"Reconstruction of antenna radiation pattern by using data of measurements in a Fresnel region with test facility intended for far-field measurements" Antenna, vol. 92, No. 1, pp. 46-52, Jan. 2005.
Soon-Soo Oh, et al; "Large Antenna Measurement in Fresnel Region Using Direct Far-Field Measurement System", Proc.Antem/URSI, pp. 79-82, Jul. 2006.
International Search Report: mailed Feb. 26, 2008, PCT/KR2007/006111.

* cited by examiner

*Primary Examiner* — Dieu H Duong
(74) *Attorney, Agent, or Firm* — Ladas & Parry LLP

(57) ABSTRACT

Provided is a system and method for measuring an antenna radiation pattern in a Fresnel region based on a phi-variation method. The system includes a rotator for changing angles of a reference antenna and a target antenna; a vector network analyzer for obtaining radiation pattern data in accordance with transmission/reception radio frequency (RF) signals between the reference antenna and the target antenna; a measurement unit for calculating a far-field radiation pattern based on the radiation pattern data received from the vector network analyzer; and a controller for controlling the rotator according to a measurement angle transmitted from the measurement unit.

13 Claims, 3 Drawing Sheets

[Fig. 1]
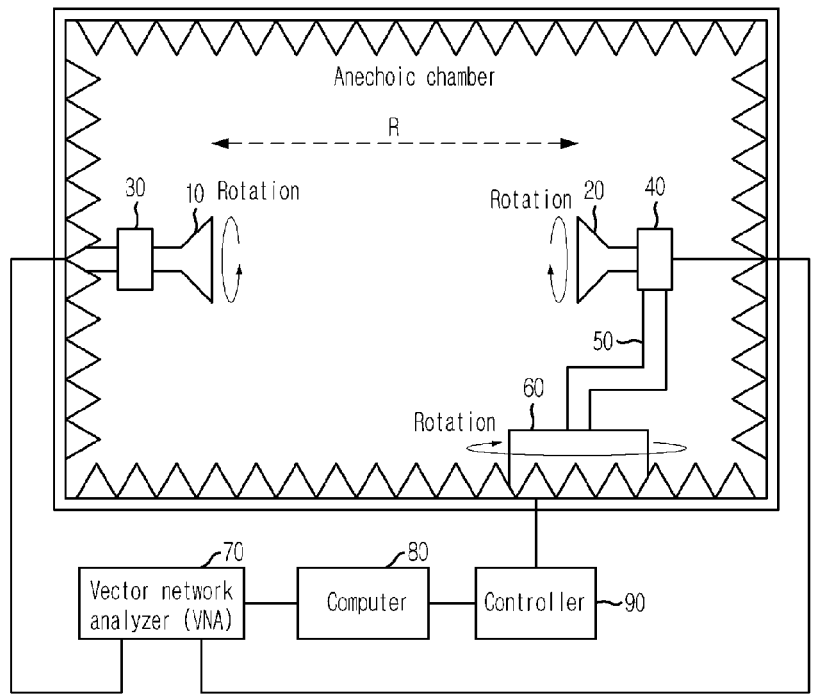
[Fig. 2]
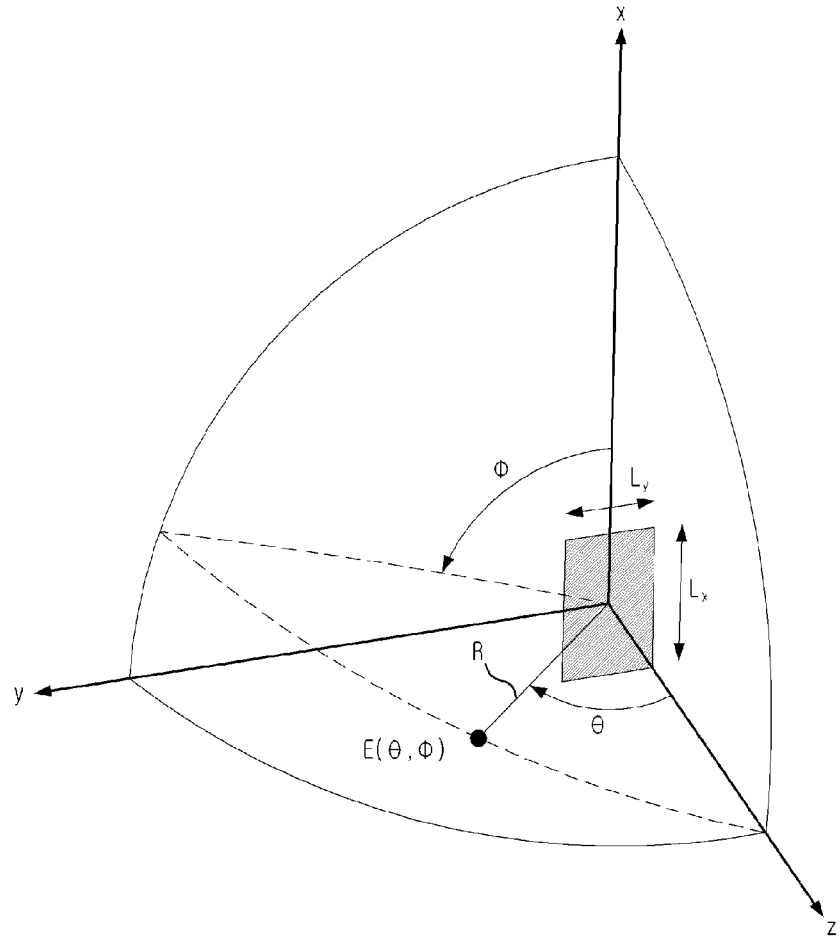

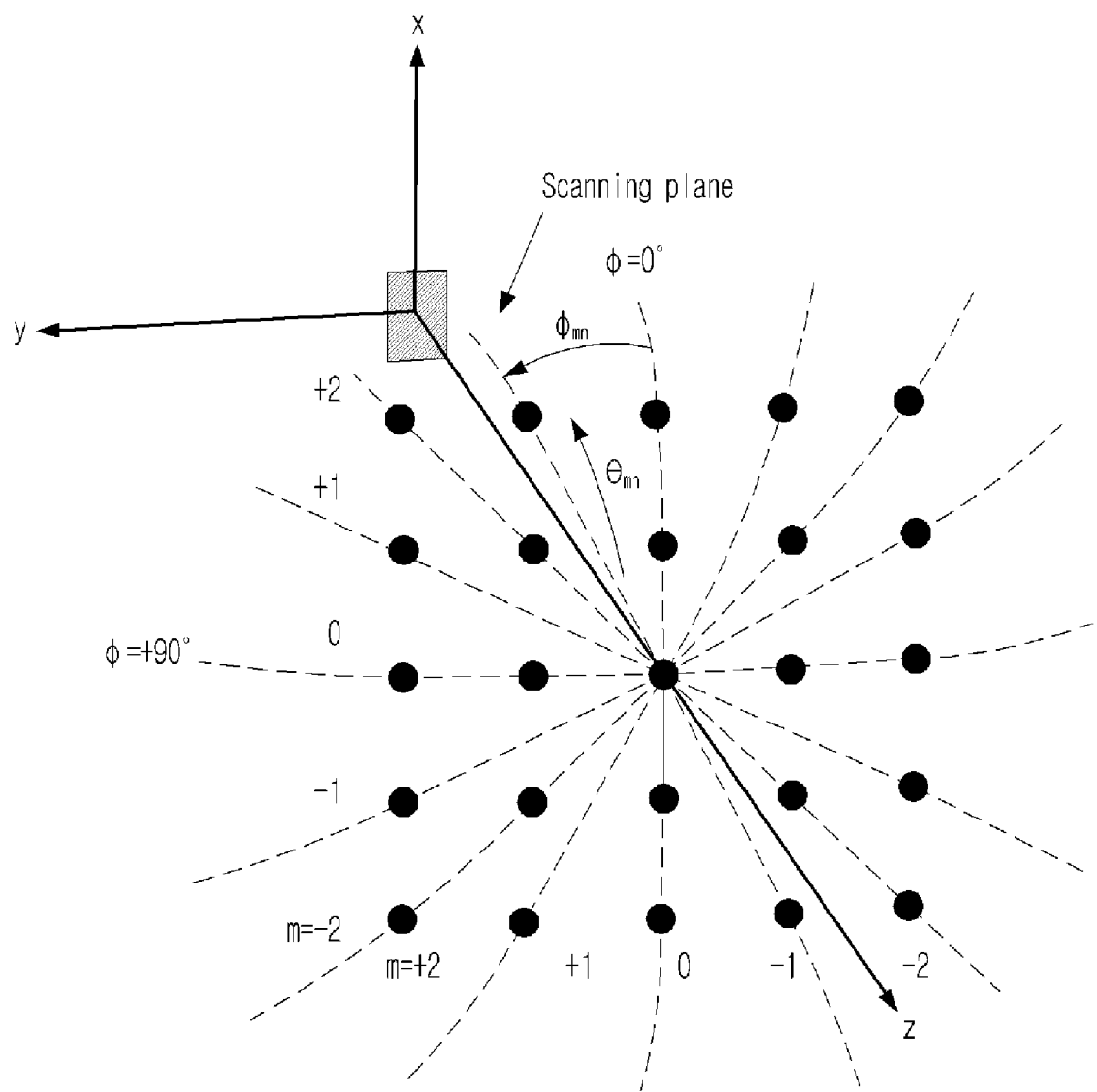
[Fig. 3]

[Fig. 4]
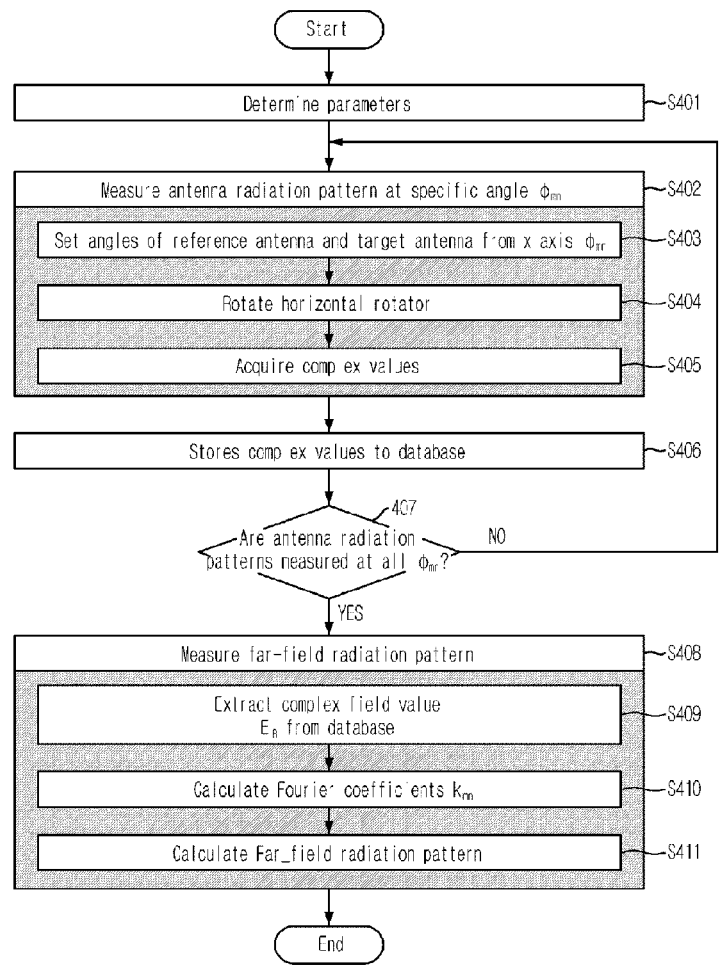
[Fig. 5]
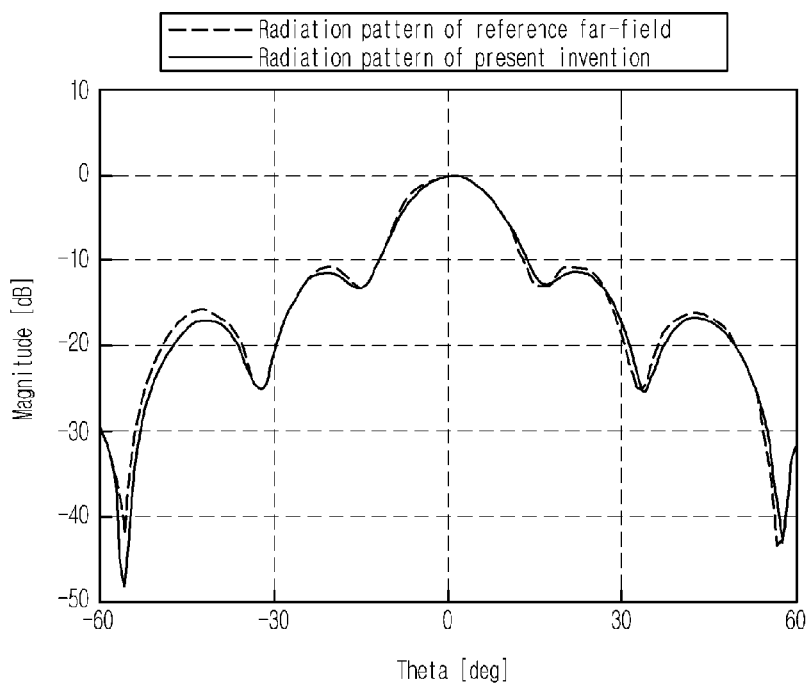

SYSTEM AND METHOD FOR MEASURING ANTENNA RADIATION PATTERN IN FRESNEL REGION BASED ON PHI-VARIATION METHOD

TECHNICAL FIELD

The present invention relates to a system and method for measuring an antenna radiation pattern in a Fresnel region based on a phi-variation method; and, more particularly, to a system and method for measuring an antenna radiation pattern in a Fresnel region based on a phi-variation method, which can measure a far-distance radiation pattern in the Fresnel region of an anechoic chamber based on the phi-variation method and a far-field measurement system.

This work was supported by the Ministry of Science and Technology ["Development of Antenna Measurement System Technology"].

BACKGROUND ART

Size of a reflector antenna for a satellite or an array antenna having a plurality of unit antennas is more than ten times that of the unit antenna.

Therefore, a minimum distance $R_{far}$ between a source antenna and a measurement antenna must satisfy $R_{far}=2\times L^2/\lambda$. Herein, L is a length of aperture of the measurement antenna, and $\lambda$ is a wavelength of operation frequency.

For example, a minimum distance for measuring a far-distance radiation pattern of $20\lambda$ antenna, i.e., $L=20\lambda$, operating in frequency 10 GHz, is 24 m. Thus, the far-distance radiation pattern cannot be measured in an anechoic chamber having a smaller distance than 24 m.

For solving the above problem, there is an open-air measurement method. However, the open-air measurement method is sensitive to the weather, and occurs interferences and errors from conventional communication services. In addition, a military antenna and a security antenna can be exposed to a spy satellite, so that secrets cannot be secured.

In another alternative, there is a compact range method which generates a plane wave in a measurement point by sending waves from the source antenna to the reflector. However, the compact range method requires a hard-adherence and high-price reflector antenna. Also, in a low frequency band, i.e., hundreds MHz, size of the reflector is large so that installation and maintenance of the reflector are difficult, and in a high frequency band, i.e., over 100 GHz, the reflector is hard to be manufactured due to µm fabrication errors.

Meanwhile, there is a near field measurement method which measures a proximity field in a short-distance region and transforms the proximity field to a far-distance radiation pattern. The near field measurement method measures vertical polarization and horizontal polarization at a place apart from a probe by distance $3\lambda\sim10\lambda$, performs Fourier transforms of the vertical polarization and the horizontal polarization and acquires the far-field radiation pattern based on the Fourier transform values. However, mechanical instruments operating the probe should be precise, thus a lot of financial resources are needed.

Therefore, a method for measuring a radiation pattern of a large-size antenna is required without a high-price system or an additional anechoic chamber.

Accordingly, a method for measuring an antenna radiation pattern in a Fresnel region and transforms the measured data to a far-distance radiation pattern is suggested, where the Fresnel region having a small distance, which is a fraction of $2L^2/\lambda$, is a intermediate region between a far-field region and near field region. During angles of an antenna to be measured are varied upward and downward, radiation patterns are measured and summed in a plurality of planes. In many published papers, it is verified that the Fresnel region measurement method has high accuracy.

However, the Fresnel region measurement method has several disadvantages in actual measurement environment. First, the Fresnel region measurement method can be applied to a far-field measurement system having a positioner that can vary angles of the antenna upward and downward. Unless, a high-price positioner should be brought.

In addition, when a large-size antenna is inclined downward in order to change angles of the large-size antenna having tens of kilograms (Kg), safety concerns such as a breakdown can occur due to weight of the antenna and the positioner. Moreover, when the angles of the antenna are varied upward and downward, undesirable reflection waves reflected from absorber adhered to a flat surface and a ceiling surface can be received, and thus measurement errors occur.

In order to solve the above problems, it is suggested that an antenna radiation pattern measuring system which can minimize the reflection waves from the flat surface and the ceiling surface by using a source antenna having high-directivity. However, in order to implement the above method, antenna to be measured should have high-directivity. Therefore, utilization of a standard antenna is low and it is not efficiency.

DISCLOSURE OF INVENTION

Technical Problem

An embodiment of the present invention is directed to providing a system and method for measuring an antenna radiation pattern based on a phi-variation method in a Fresnel region which can measure a far-distance radiation pattern in the Fresnel region of an anechoic chamber based on the phi-variation method and a far-field measurement system.

Other objects and advantages of the present invention can be understood by the following description, and become apparent with reference to the embodiments of the present invention. Also, it is obvious to those skilled in the art of the present invention that the objects and advantages of the present invention can be realized by the means as claimed and combinations thereof.

Technical Solution

In accordance with an aspect of the present invention, there is provided a system for measuring an antenna radiation pattern in a Fresnel region based on a phi-variation method, including: a rotator for changing angles of a reference antenna and a target antenna; a vector network analyzer for obtaining radiation pattern data in accordance with transmission/reception radio frequency (RF) signals between the reference antenna and the target antenna; a measurement unit for calculating a far-field radiation pattern based on the radiation pattern data received from the vector network analyzer; and a controller for controlling the rotator according to a measurement angle transmitted from the measurement unit.

In accordance with another aspect of the present invention, there is provided a method for measuring an antenna radiation pattern in a Fresnel region based on a phi-variation method, including: changing angles of a reference antenna and a target antenna based on a measurement angles; obtaining radiation pattern data in accordance with transmission/reception radio frequency (RF) signals between the reference antenna and the target antenna; repeating the obtaining radiation pattern data for all measurement angles; and calculating a far-field radiation pattern based on the obtained radiation pattern data.

Advantageous Effects

The present invention can be applied to a popular antenna radiation pattern measuring system, i.e., a far-field measurement system having a positioner which can rotate an antenna into phi direction and theta direction, and thus additional cost which occurs in the general chamber not satisfying the far-field condition due to the large antenna aperture, can be reduced.

Also, in the present invention, since angles of one antenna, which is the target antenna, are not varied upward and downward, the other antenna, which is the reference antenna, does not require high-directivity, and the standard antenna can be utilized.

BRIEF DESCRIPTION OF THE DRAWINGS

FIG. 1 is a block diagram illustrating a system for measuring an antenna radiation pattern in a Fresnel region based on a phi-variation method in accordance with an embodiment of the present invention.

FIG. 2 illustrates an antenna angle coordinate system in accordance with an embodiment of the present invention.

FIG. 3 illustrates a method for measuring an antenna radiation pattern in a Fresnel region based on a phi-variation method in accordance with an embodiment of the present invention.

FIG. 4 is a flowchart illustrating a method for measuring an antenna radiation pattern in a Fresnel region based on a phi-variation method in accordance with an embodiment of the present invention.

FIG. 5 illustrates graph showing an E-plane radiation pattern of reference far-field and an E-plane radiation pattern of the present invention.

BEST MODE FOR CARRYING OUT THE INVENTION

The advantages, features and aspects of the invention will become apparent from the following description of the embodiments with reference to the accompanying drawings, which is set forth hereinafter, and thus the invention will be easily carried out by those skilled in the art to which the invention pertains. Also, when it is considered that detailed description on a related art may obscure the points of the present invention unnecessarily in describing the present invention, the description will not be provided herein. Hereinafter, specific embodiments of the present invention will be described with reference to the accompanying drawings.

FIG. 1 is a block diagram illustrating a system for measuring an antenna radiation pattern in a Fresnel region based on a phi-variation method in accordance with an embodiment of the present invention.

As shown in FIG. 1, the system for measuring the antenna radiation pattern in the Fresnel region based on the phi-variation method includes a reference antenna 10, a target antenna 20, a first vertical rotator 30, a second vertical rotator 40, a horizontal rotator 60, a vector network analyzer (VNA) 70, a computer 80 and a controller 90.

The reference antenna 10 and the target antenna 20 are apart distance R from each other to measure a far-field radiation pattern in an anechoic chamber. The first vertical rotator 30 and the second vertical rotator 40 change an angle i.e., phi(φ), of the reference antenna 10 and the target antenna 20, respectively, e.g., the first vertical rotator 30 and the second vertical rotator 40 rotate the reference antenna 10 and the target antenna 20 around a horizontal axis, respectively. The horizontal rotator 60 horizontally rotates a rotation axis 50 to acquire data based on rotation angles, e.g., the horizontal rotator 60 rotates the target antenna 20 around a vertical axis.

The VNA 70 transmits RF signals to one antenna of the reference antenna 10 and the target antenna 20, i.e., a transmitting antenna, receives RF signals through a RF cable from the other antenna, i.e., a receiving antenna, and extracts complex values of the received RF signals. The computer 80 stores the complex values extracted from the VNA 70, calculates a far-field radiation pattern and transmits a measurement angle to the controller 90. The controller 90 controls a motor (not shown) for driving the first vertical rotator 30, the second vertical rotator 40 and the horizontal rotator 60 based on the measurement angle.

Herein, the reference antenna 10 and the target antenna 20 can be switched, and the final measurement results are the same.

Moreover, the second vertical rotator 40 can be coupled to the horizontal rotator 60, and the target antenna 20 can be rotated around the vertical axis and the horizontal axis by the horizontal rotator 60.

FIG. 2 illustrates an antenna angle coordinate system in accordance with an embodiment of the present invention.

As shown in FIG. 2, the antenna is located on the origin of the coordinate system. $L_x$ is a x-axis length of the aperture of the target antenna 20 of which the radiation pattern is to be acquired, and $L_y$ is a y-axis length of the aperture of the target antenna 20.

Also, R is a distance from the origin to a field value $E(\theta, \phi)$ to be measured; $\theta$ is an angle from z axis, and $\phi$ is an angle from x axis.

FIG. 3 illustrates a method for measuring an antenna radiation pattern in a Fresnel region based on a phi-variation method in accordance with an embodiment of the present invention. Particularly, a method for measuring the antenna radiation pattern is described when $\theta$ is 0 degree, and $\phi$ is 0 degree.

As shown in FIG. 3, the target antenna is located on the origin. Also, dotted lines denote scanning planes which are routes for measuring the antenna radiation pattern by rotating the horizontal rotator 60.

As the following Eq. 1, field values $E_{far}(\theta, \phi)$ of the far-field region can be acquired by multiplying field values $E_R(\theta_{mn}, \phi_{mn})$ of the Fresnel region by Fourier coefficients $k_{mn}$, and summing the multiplication values. $E_R(\theta_{mn}, \phi_{mn})$ are a plurality of points of a spherical surface apart from the origin by distance R.

$$E_{far}(\theta, \phi) = \sum_{m=-M}^{+M} \sum_{n=-N}^{+N} [k_{mn} \times E_R(\theta_{mn}, \phi_{mn})] \qquad \text{Eq. 1}$$

Herein, $\theta$ is an angle from z axis, and $\phi$ is an angle from x axis.

$$k_{mn} = \frac{1}{L_x L_y} \int_{-L_x/2}^{L_x/2} e^{+ic^2 u^2} e^{-i\frac{2\pi}{L_x}mu} du \int_{-L_y/2}^{L_y/2} e^{+ic^2 v^2} e^{-i\frac{2\pi}{L_y}nv} dv \qquad \text{Eq. 2}$$

Herein, $c=\sqrt{(\pi/\lambda R)}$; $L_x$ is an x-axis length of the aperture of the target antenna if which the radiation pattern wants to be acquired; and $L_y$ is a y-axis length of the aperture of the target antenna.

If θ and φ range from −90° to +90° there are numerous $\theta_{mn}$ and $\phi_{mn}$. Actually, the antenna radiation pattern is measured in every same distance, and a value of the most nearest point is taken or an approximate value by using an interpolation is acquired.

FIG. 4 is a flowchart illustrating a method for measuring an antenna radiation pattern in a Fresnel region based on a phi-variation method in accordance with an embodiment of the present invention.

First, an user determines measurement parameters e.g., a distance between the reference antenna 10 and the target antenna 20, size of antenna aperture and a measurement angle at step S401.

Then, the user measures an antenna radiation pattern at specific angle $\phi_{mn}$ in an antenna radiation pattern measuring system at step S402.

The step S402 will be described in detail hereinafter.

At step S403, the user vertically rotates the reference antenna 10 and the target antenna 20 and sets angles of the reference antenna 10 and the target antenna 20 at $\phi_{mn}$, and horizontally rotates a rotation axis 50 by using a horizontal rotator 60 at step S404.

Then, the vector network analyzer (VNA) 70 of the rotated antenna radiation pattern measuring system acquires complex values by receiving RF signals at step S405.

Then, the antenna radiation pattern measuring system stores the acquired complex values to a database at step S406.

Then, the antenna radiation pattern measuring system performs processes at steps S402 to S406 for all angles at step S407.

Next, the antenna radiation pattern measuring system measures a far-field radiation pattern based on Eqs. 1 and 2 at step S408.

The step S408 will be described in detail hereinafter.

The antenna radiation pattern measuring system extracts a complex field value $E_R$ from the database at step S409.

Then, the antenna radiation pattern measuring system calculates Fourier coefficients $k_{mn}$ based on Eq. 2 at step S410.

Then, the antenna radiation pattern measuring system measures the far-field radiation pattern based on the extracted complex field value $E_R$ and the calculated Fourier coefficients $k_{mn}$ based on Eq. 1 at step S411.

In order to verify the method for measuring the antenna radiation pattern in the Fresnel region based on the phi-variation method of the present invention, an antenna radiation pattern of a horn antenna is measured in the Fresnel region. Herein, the horn antenna cannot satisfy a far-field condition in a small-size anechoic chamber.

Also, a reference far-field radiation pattern is measured from a distance satisfying the far-field condition in a large-size anechoic chamber. Then, the reference far-field radiation pattern and the radiation pattern measured by the phi-variation method of the present invention are compared.

FIG. 5 illustrates graph showing an E-plane radiation pattern of reference far-field and an E-plane radiation pattern of the present invention.

As shown in FIG. 5, the E-plane radiation pattern of the present invention is almost identical to the E-plane radiation pattern of reference far-field.

The present application contains subject matter related to Korean Patent Application No. 10-2006-0121761, filed in the Korean Intellectual Property Office on Dec. 4, 2006, the entire contents of which are incorporated herein by reference.

While the present invention has been described with respect to certain preferred embodiments, it will be apparent to those skilled in the art that various changes and modifications may be made without departing from the scope of the invention as defined in the following claims.

The invention claimed is:

1. A system for measuring an antenna radiation pattern in a Fresnel region based on a phi-variation method, comprising:
   a rotating means for changing angles of a reference antenna and a target antenna;
   a vector network analyzing means for obtaining radiation pattern data in accordance with transmission/reception radio frequency (RF) signals between the reference antenna and the target antenna, wherein the obtained radiation pattern comprises spherical waves;
   a measurement means for calculating a far-field radiation pattern of a far-field region based on the radiation pattern data received from the vector network analyzing means; and
   a control means for controlling the rotating means according to a measurement angle transmitted from the measurement means,
   wherein field values of the far-field radiation pattern of the far-field region are acquired by multiplying field values of the Fresnel region by Fourier coefficients and summing multiplied field values.

2. The system of claim 1, wherein the rotating means includes:
   a first rotating means for rotating the reference antenna around a horizontal axis;
   a second rotating means for rotating the target antenna around the horizontal axis; and
   a third rotating means for rotating the target antenna around a vertical axis.

3. The system of claim 2, wherein the second rotating means is coupled to the third rotating means and the target antenna can be rotated around the vertical axis and the horizontal axis by the third rotating means.

4. The system of claim 1, wherein the measurement means calculates the far-field radiation pattern based on the radiation pattern data obtained in the vector network analyzing means and Fourier coefficients of the target antenna.

5. The system of claim 4, wherein the vector network analyzing means outputs the RF signals to one antenna among the reference antenna and the target antenna, and extracts complex field values based on the RF signals received from the other antenna.

6. The system of claim 5, wherein the measurement means calculates the far-field radiation pattern applying the Fourier coefficients to the complex field values extracted in the vector network analyzing means.

7. The system of claim 6, wherein the complex field values are field values of the Fresnel region at a plurality of points of a spherical surface apart by distance R, where R is a distance between the reference antenna and the target antenna.

8. A method for measuring an antenna radiation pattern in a Fresnel region based on a phi-variation method, comprising:
   changing angles of a reference antenna and a target antenna based on measurement angles by a rotating means;
   obtaining radiation pattern data in accordance with transmission/reception radio frequency (RF) signals between the reference antenna and the target antenna by a vector network analyzing means, wherein the obtained radiation pattern comprises spherical waves;

repeating the obtaining radiation pattern data for all measurement angles;

calculating a far-field radiation pattern of a far-field region based on the obtained radiation pattern data by a measurement means, and controlling the rotating means according to a measurement angle transmitted from the measurement means by a control means, wherein field values of the far-field radiation pattern of the far-field region are acquired by multiplying field values of the Fresnel region by Fourier coefficients and summing multiplied field values.

9. The method of claim 8, wherein the changing angles includes:

rotating the reference antenna around a horizontal axis based on the measurement angles;

rotating the target antenna around the horizontal axis based on the measurement angles; and rotating the target antenna around a vertical axis.

10. The method of claim 8, wherein the far-field radiation pattern is calculated based on the obtained radiation pattern data and Fourier coefficients of the target antenna.

11. The method of claim 9, wherein the far-field radiation pattern is calculated by applying the Fourier coefficients to complex field values of the obtained radiation pattern data.

12. The method of claim 11, wherein the complex field values are field values of the Fresnel region at a plurality of points of a spherical surface apart by distance R, where R is a distance between the reference antenna and the target antenna.

13. A system for measuring an antenna radiation pattern in a Fresnel region based on a phi-variation method, comprising:

a rotating means for changing angles of a reference antenna and a target antenna;

a vector network analyzing means for obtaining radiation pattern data in accordance with transmission/reception radio frequency (RF) signals between the reference antenna and the target antenna, wherein the reference antenna and the target antenna are separate by a distance R that only produces the radiation pattern of the Fresnel region;

a measurement means for calculating a far-field radiation pattern of a far-field region based on the radiation pattern data received from the vector network analyzing means; and a control means for controlling the rotating means according to a measurement angle transmitted from the measurement means, wherein field values of the fair-field radiation pattern of the far-field region are acquired by multiplying field values of the Fresnel region by Fourier coefficients and summing multiplied field values.

* * * * *